(12) United States Patent
Farnsworth et al.

(10) Patent No.: US 10,716,235 B1
(45) Date of Patent: Jul. 14, 2020

(54) ADJUSTABLE MOUNTING RAIL LATCHES

(71) Applicant: Cisco Technology, Inc., San Jose, CA (US)

(72) Inventors: Arthur K. Farnsworth, Austin, TX (US); Jordon Wahl, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/264,945

(22) Filed: Feb. 1, 2019

(51) Int. Cl.
*H05K 7/18* (2006.01)

(52) U.S. Cl.
CPC .................................... *H05K 7/183* (2013.01)

(58) Field of Classification Search
CPC ....... H05K 7/183; H05K 7/186; H05K 7/1489
See application file for complete search history.

(56) References Cited

U.S. PATENT DOCUMENTS

| | | | | |
|---|---|---|---|---|
| 5,480,310 A * | 1/1996 | Baum | ................. | H01R 9/2691 439/716 |
| 5,716,241 A * | 2/1998 | Hennemann | ............ | G06F 1/184 439/716 |
| 5,775,955 A * | 7/1998 | Graube | ................ | H01R 9/2408 439/716 |
| 5,803,772 A * | 9/1998 | Muller | ................. | H01R 9/2608 439/716 |
| 5,904,592 A * | 5/1999 | Baran | .................... | H02B 1/052 361/627 |
| 5,907,476 A * | 5/1999 | Davidsz | ................. | H02B 1/052 361/729 |
| 6,038,130 A * | 3/2000 | Boeck | .................. | H01R 9/2675 361/735 |
| 6,172,875 B1 * | 1/2001 | Suzuki | .................... | G06F 1/183 361/679.4 |
| 6,431,909 B1 * | 8/2002 | Nolden | ................ | H01R 9/2608 361/735 |
| 6,471,552 B2 * | 10/2002 | Bechaz | ................ | H01R 9/2691 267/160 |
| 6,475,036 B2 * | 11/2002 | Morikawa | .......... | H01R 13/6395 439/716 |

(Continued)

OTHER PUBLICATIONS

"Modular PCB Holders DIN Rail or Panel Mount", Universal mounting for 73 & 108 mm width PCB, www.gaurang.com/gaurang_data/productfiles/1394998634077_pdf.pdf, downloaded from the internet on Jan. 31, 2019, 2 pages.

(Continued)

*Primary Examiner* — Stanton L Krycinski
(74) *Attorney, Agent, or Firm* — Edell, Shapiro & Finnan, LLC

(57) ABSTRACT

Presented herein are adjustable mounting rail latches that each comprise first and second latch modules. The latch modules each have a first side configured to be attached to at least one equipment unit, and a second side that includes an attachment system configured to be mechanically coupled to a mounting rail. A slide-rail system is integrated with each of the first and second latch modules that is configured to slideably couple the first latch module with the second latch module. Additionally, the adjustable mounting rail latches comprise at least one selectively engageable retention device configured to exert a force on the mounting rail to prevent movement of the first and second latch modules along the mounting rail.

20 Claims, 10 Drawing Sheets

(56) References Cited

U.S. PATENT DOCUMENTS

| | | | |
|---|---|---|---|
| 6,543,957 B1* | 4/2003 | Raspotnig | H02B 1/052 403/286 |
| 6,935,903 B2* | 8/2005 | Gaidosch | H02B 1/052 439/716 |
| 7,073,971 B2* | 7/2006 | Schurr | H02B 1/052 403/325 |
| 7,374,453 B1* | 5/2008 | Allcock | B66C 7/08 439/532 |
| 7,416,421 B2* | 8/2008 | Kapinos | H02B 1/052 439/94 |
| 7,686,626 B2* | 3/2010 | Wu | H01R 4/64 439/95 |
| 7,686,627 B2* | 3/2010 | Wu | H01R 9/2608 439/95 |
| 7,695,313 B2* | 4/2010 | Karim | H02B 1/052 439/540.1 |
| 7,758,368 B2* | 7/2010 | Schelonka | H02B 1/052 439/325 |
| 7,938,690 B2* | 5/2011 | Henkel | H02B 1/052 439/716 |
| 7,980,891 B2* | 7/2011 | Molnar | H02B 1/052 361/735 |
| 8,062,061 B2* | 11/2011 | Lim | H02B 1/052 439/532 |
| 8,066,239 B2* | 11/2011 | Molnar | H02B 1/052 248/214 |
| 9,032,593 B2* | 5/2015 | Rayos | F16B 17/00 24/462 |
| 9,088,138 B2* | 7/2015 | Yu | H02B 1/0526 |
| 9,263,861 B2* | 2/2016 | Schumacher | H01R 9/2608 |
| 9,303,811 B1 | 4/2016 | Lutz, Jr. et al. | |
| 9,313,907 B2* | 4/2016 | Heimerl | H05K 5/0204 |
| 9,353,777 B2* | 5/2016 | Eminovic | H02B 1/052 |
| 9,444,231 B2* | 9/2016 | Ho | H02B 1/0523 |
| 9,485,879 B2* | 11/2016 | Molnar | H05K 5/0026 |
| 9,699,930 B2* | 7/2017 | Miura | H01R 13/514 |
| 9,865,945 B2* | 1/2018 | Isobe | H01R 9/2608 |
| 9,879,705 B2* | 1/2018 | Downes | F16B 2/18 |
| 9,936,598 B2* | 4/2018 | Gruber | H01R 9/2675 |
| 10,306,796 B2* | 5/2019 | Huang | H05K 13/04 |
| 2014/0268512 A1 | 9/2014 | Kho et al. | |

OTHER PUBLICATIONS

"DIN rail basics", Design News, https://www.designnews.com/electronics-test/din-rail-basics/151128668527601, Jun. 18, 2001, 11 pages.

* cited by examiner

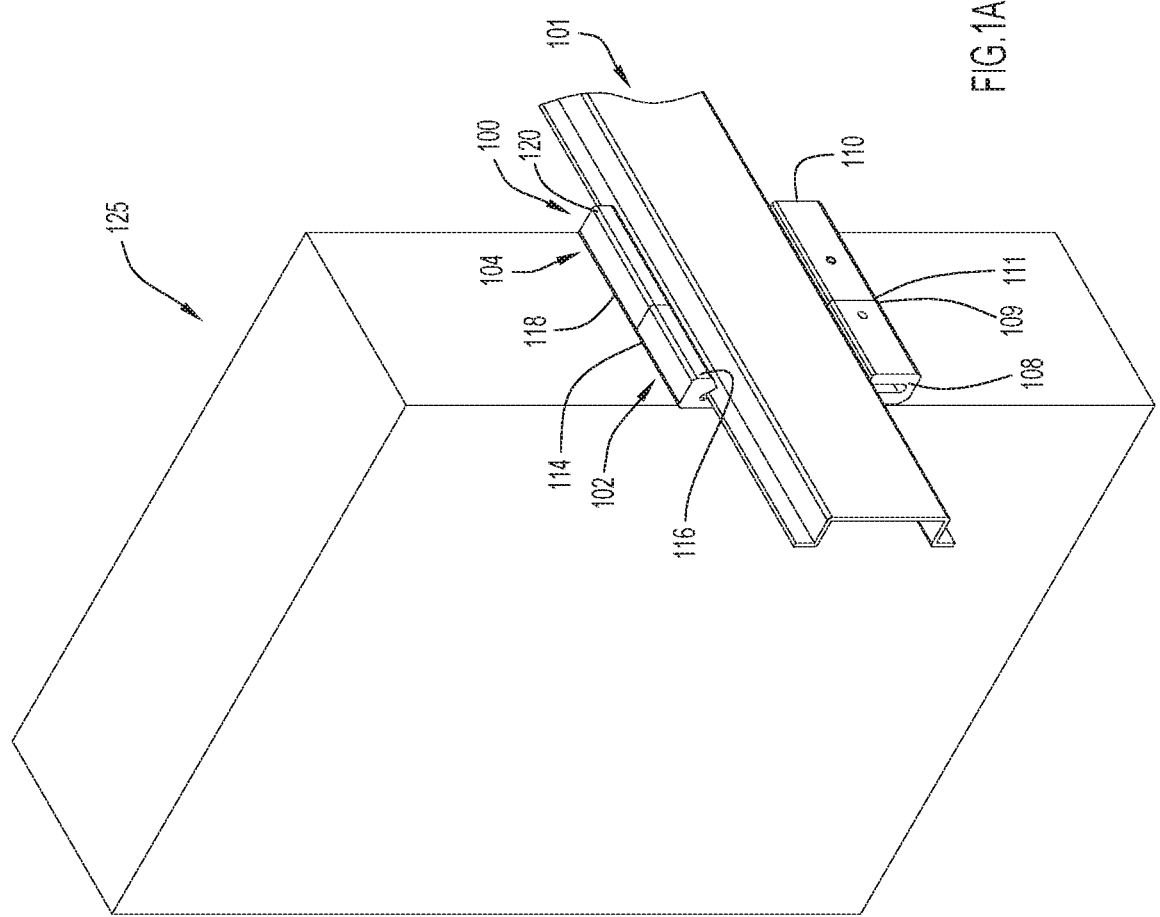

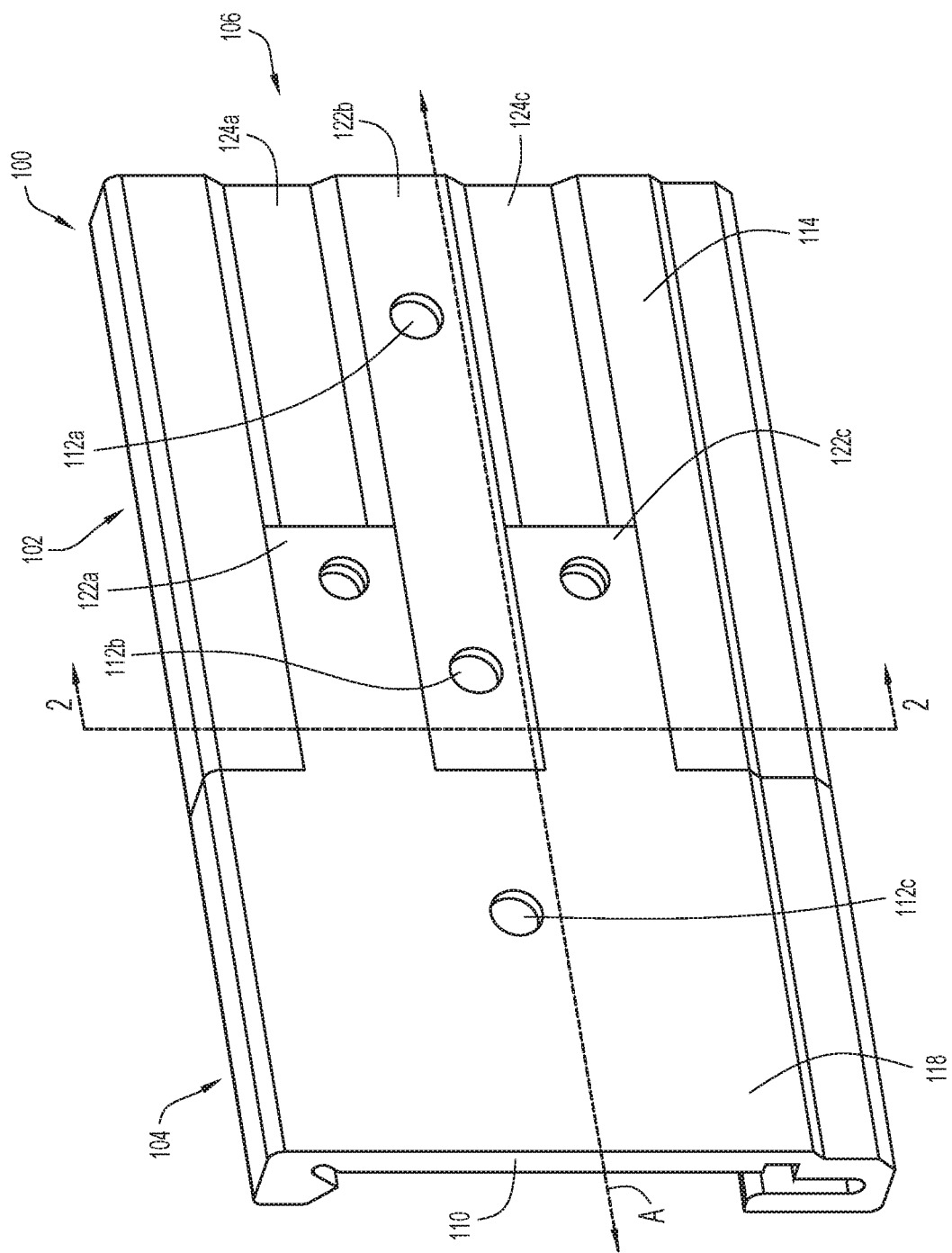

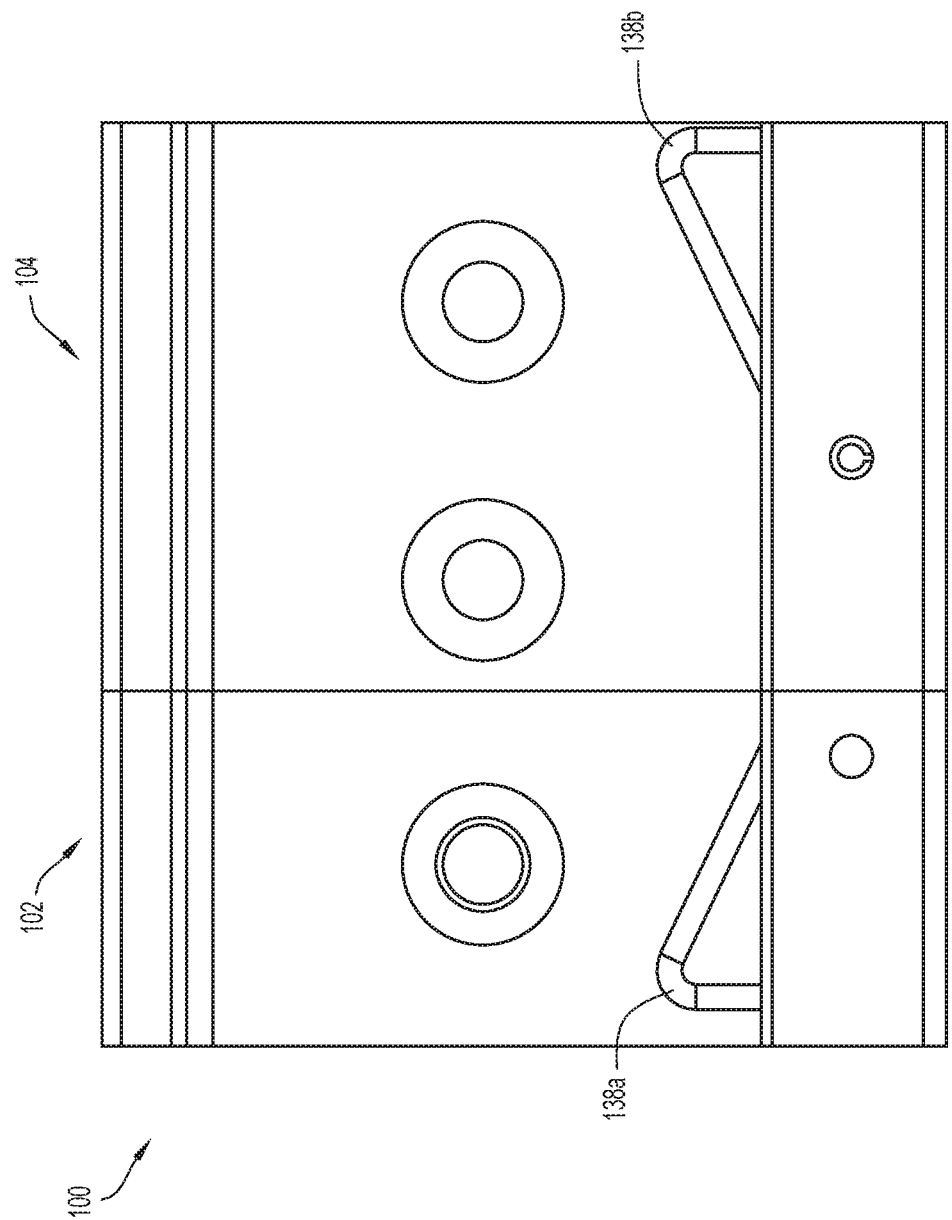

ADJUSTABLE MOUNTING RAIL LATCHES

TECHNICAL FIELD

The present disclosure relates generally to adjustable latches for use with mounting rails.

BACKGROUND

It is common for various electronic systems, such as equipment units, to be mounted onto equipment racks via mounting rails (DIN rails) and latches/brackets. In general, the term "DIN" originates from the original specifications published by Deutsches Institut fur Normung (DIN) in Germany, which have since been adopted as European (EN) and international (IEC) standards. In typical arrangements, a DIN mounting latch/bracket is used to mechanically couple an electronic system to a DIN rail.

BRIEF DESCRIPTION OF THE DRAWINGS

FIG. 1A is a perspective view of an adjustable mounting rail latch, according to an example embodiment, shown in a closed configuration and mechanically coupled to a mounting rail and to a first equipment unit.

FIG. 2A is a rear perspective view of the adjustable mounting rail latch of FIG. 1A shown in a closed configuration and separate from the mounting rail and the first equipment unit.

FIG. 4A is a front view of the adjustable mounting rail latch of FIG. 1A, shown in a closed configuration and separate from the mounting rail and the first equipment unit.

DESCRIPTION OF EXAMPLE EMBODIMENTS

Overview

Figure 1B:
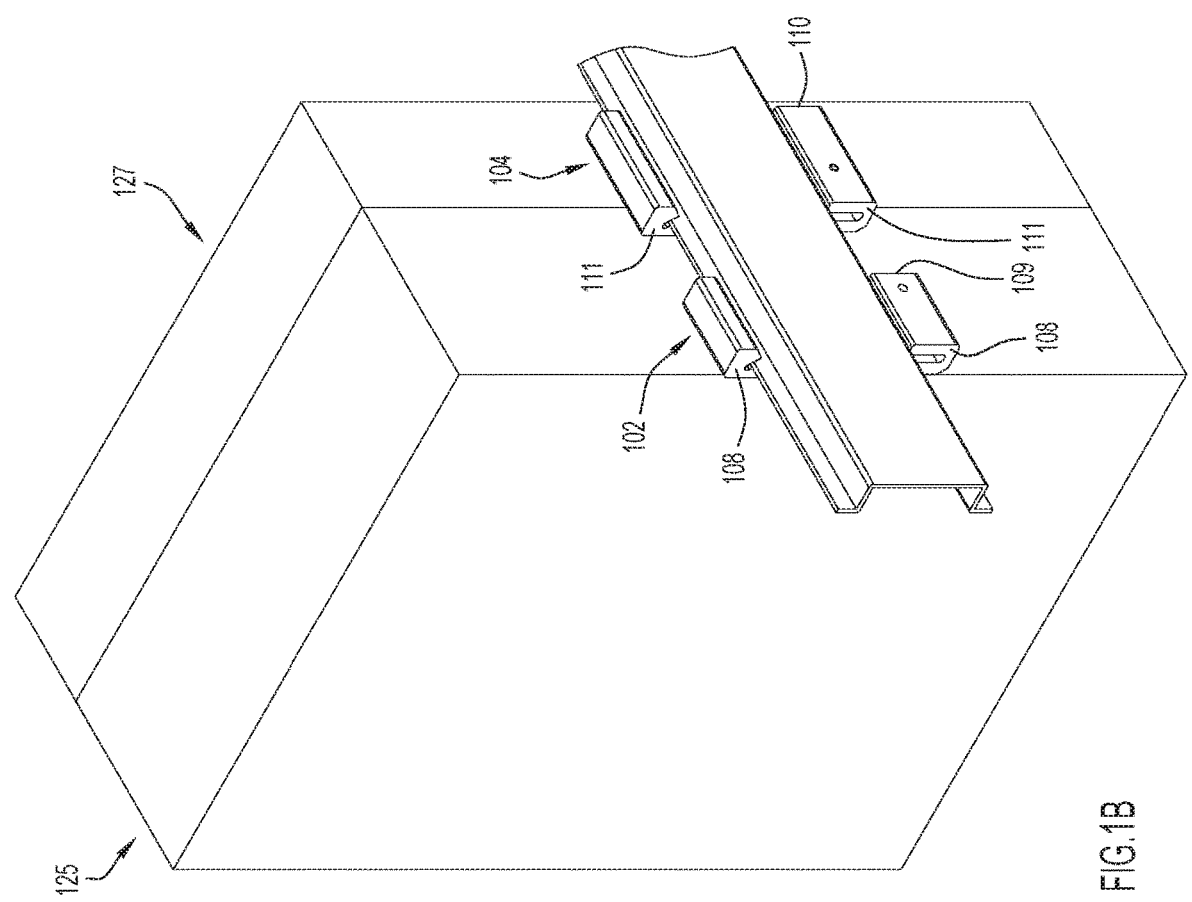
FIG. 1B is a perspective view of the adjustable mounting rail latch of FIG. 1A shown in an open configuration and mechanically coupled to the mounting rail and to the first equipment unit.

Presented herein are adjustable mounting (DIN) rail latches. An adjustable mounting rail latch comprises first and second latch modules that each have a first side and a second side. The first sides are configured to be attached to at least one equipment unit and each of the second sides includes an attachment system configured to mechanically couple to a mounting rail. A slide-rail system is integrated with each of the first and second latch modules that is configured to slideably couple the first latch module with the second latch module. Additionally, the adjustable mounting rail latch comprises at least one selectively engageable retention device configured to exert a force on the mounting rail to prevent movement of the first and second latch modules along the mounting rail.

EXAMPLE EMBODIMENTS

Today, various customizable options are available for installation of electronic systems, such as network equipment units or other types of equipment units. For example, a first equipment unit (e.g., a base unit) that provides one or more features may be initially deployed by a user. At a later time, one or more additional equipment units (e.g., expansion units) may be deployed with the base unit in order to provide additional and/or supplementary features. In certain arrangements, users may have the flexibility to select different expansion units for use with the base unit (e.g., for a particular use/application). However, as a result of this flexibility, the form factor of the equipment may change. For example, the form factor (e.g., width and weight) of the deployed equipment may increase in different manners for different types of expansion units.

Electronic systems, such as equipment units, are often attached to equipment racks, for example, inside a cabinet via mounting rails, generally referred to herein as DIN rails, for example, and mounting (DIN) rail latches/brackets. Conventional mounting rail latches used to mount base units onto mounting rails may be inadequate, for example, in size and/or retention ability, for mounting both the base unit and any additional expansion units attached to the base unit. One solution to such a problem is to use multiple latches or a single, wider latch on the now wider product assembly. However, this solutions is inefficient as it takes considerable time to install/configure and the additional latches need to be ordered by the customer. It is also not cost affective for the mounting rail latch provider in terms of managing multiple latch accessory options to accommodate different customer configurations.

As such, presented herein are adjustable (sliding) mounting (DIN) rail latches for use in attaching one or more equipment units to a mounting rail. More specifically, an adjustable mounting rail latch in accordance with examples presented herein has a first (closed) configuration that enables the mounting rail latch to be used for attachment of a first equipment unit (e.g., a base unit) to a mounting rail. If the customer adds one or more additional equipment units (e.g., expansion units) in the future, the same mounting rail latch can be subsequently adjusted to a second (open) configuration that enables the mounting rail latch to also be used for attachment of the expansion unit(s) to the mounting rail.

The adjustable/sliding mounting rail latch in accordance with examples presented herein is comprised of first and second latch modules coupled to one another via an integrated slide-rail system. The slide-rail system enables the first and second latch modules to be positioned adjacent one another in the first (closed) configuration for use in mounting the base unit to a mounting rail. When an expansion unit is added to the configuration, growing the form factor of the product, the slide-rail system enables the first and second latch modules to be separated from one another to form the second (open) configuration. In other words, the integrated slide-rail system allows the adjustable mounting rail latch to become wider so as to also accommodate the expansion unit. This slide-rail system is configured to have different widths in the open configuration.

The adjustable mounting rail latches presented herein enable the end users to quickly and easily adjust the dimensions of the latch to conform to a product's changing form factor (e.g., as equipment units are added, removed, replaced, etc.). That is, instead of un-installing and re-installing new latch designs each time the product form factor changes, at least a part of the adjustable mounting rail latch may remain attached and may be adjusted depending on the configuration change. As such, use of the adjustable mounting rail latch simplifies customer product upgrades.

For ease of description, adjustable (sliding) mounting rail latches in accordance with embodiments presented herein are described with reference to DIN rails and DIN rail latches. However, this is not intended to be limiting. It is to be understood that adjustable mounting rail latches in accordance with embodiments presented herein may be configured for use with any suitable type(s) of mounting rail(s).

FIG. 1A is a front perspective view of an adjustable DIN rail latch 100 in accordance with embodiments presented herein. The adjustable DIN rail latch 100 may be formed from aluminum, a rigid polymer, and/or any other suitable materials. In FIG. 1A, the adjustable DIN rail latch 100 is shown in a closed configuration, where the adjustable DIN rail latch 100 is mechanically coupled/attached to both a DIN rail 101 and to a first equipment unit 125.

As shown, the adjustable DIN rail latch 100 includes a first latch module 102 and a second latch module 104. As described further below, the first latch module 102 includes a first side 114 (e.g., a back side) and a second side 116 (e.g., a front side). The second latch module 104 includes a first side 118 (e.g., a back side) and a second side 120 (e.g., a front side). Each of the first sides 114, 118 is configured to be attached to at least one equipment unit. Each of the second sides 116, 120 is configured to be attached to a DIN rail. In the example shown in FIG. 1A, each of the first sides 114, 118 is attached to the first equipment unit 125 and each of the second sides 116, 120 is attached to the DIN rail 101. The first latch module 102 and a second latch module 104 are attached to one another via an integrated slide-rail system (not shown in FIG. 1A).

As noted, FIG. 1A illustrates the adjustable DIN rail latch 100 in a closed configuration. When the adjustable DIN rail latch 100 is in a closed configuration, the first latch module 102 and the second latch module 104 are positioned immediately adjacent one another (i.e., the adjustable DIN rail latch is configured at its minimum form factor width). In this arrangement, the adjustable DIN rail latch 100 is attached to the first equipment unit 125.

Referring next to FIG. 1B, shown is a perspective view of the adjustable DIN rail latch 100 in an open configuration. In an open configuration, the adjustable DIN rail latch 100 is mechanically coupled to the DIN rail 101, the first equipment unit 125, and a second equipment unit 127, according to an example embodiment. More specifically, in FIG. 1B, the first latch module 102 and the second latch module 104 are shown separated from one another (e.g., non-adjacent to one another), where one or both of the latch modules 102, 104 have been moved (slid) along the integrated slide-rail system 106. As such, in FIG. 1B, the adjustable DIN rail latch 100 has a different form factor width than in the closed configuration of FIG. 1A. Due to this different form factor width, the adjustable DIN rail latch 100 is able to be attached to both the first equipment unit 125 and the second equipment unit 127.

As shown, the first latch module 102 has a first end 108 and a second end 109, while the second latch module 104 has a first end 110 and a second end 111. In the closed configuration of FIG. 1A, second ends 109 and 111 of the first and second latch modules 102, 104, respectively, are immediately adjacent one another (e.g., abutting one another). In an open configuration, the second ends 109 and 111 of the first and second latch modules 102, 104, respectively, are separated from one another. The form factor width of the adjustable DIN rail latch 100 is defined as the distance between ends 108, 110 of the adjustable DIN rail latch 100.

As described further below, the first latch module 102 and the second latch module 104 are each configured to be mechanically coupled to the DIN rail 101. Additionally, while in the closed configuration, the adjustable DIN rail latch 100 (FIG. 1A) is used to attach the first equipment unit 125 to the DIN rail 101. At a subsequent point in time, the second equipment unit 127 may be provided to for example, upgrade the first equipment unit 125, provide supplemental functionality, etc. To install the second equipment unit 127, the adjustable DIN rail latch 100 is adjusted to the open configuration (e.g., the first latch module 102 and the second latch module 104 are separated from one another). The adjustable DIN rail latch 100 may be adjusted from the first configuration to the second configuration based on the wider form factor of the first and second equipment units 125, 127 as compared to the first equipment unit 125. The adjustable DIN rail latch 100 may be adjusted between/to different form factor widths based on the particular equipment unit(s) being attached (e.g., added or removed) to the adjustable DIN rail latch 100.

Once opened, the adjustable DIN rail latch 100 remains attached to the first equipment unit 125, and can then be attached to the second equipment unit 127. The first and second equipment units 125, 127 may or may not be connected to each other.

Figure 2C:
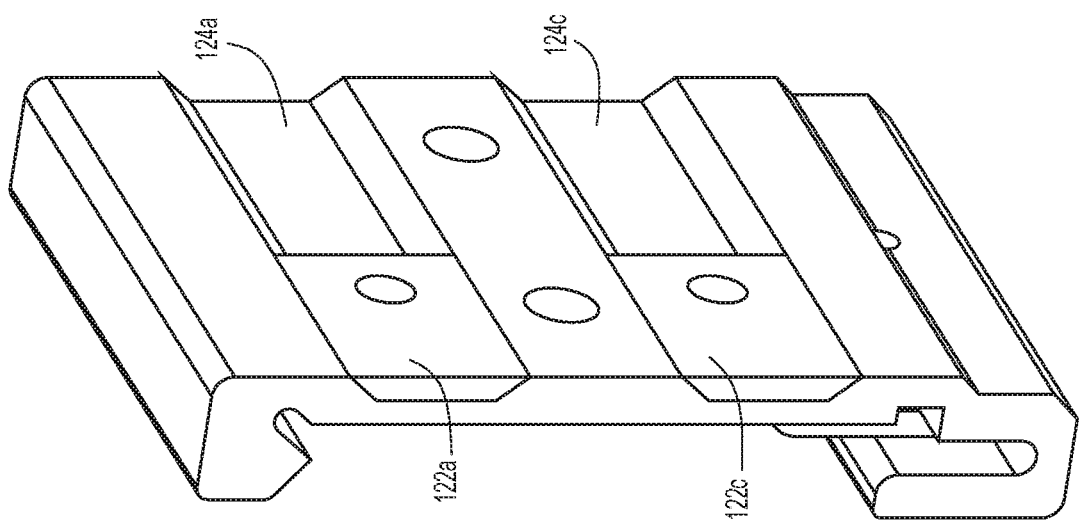
FIG. 2C is another rear perspective view of a section of the adjustable mounting rail latch of FIG. 1A shown separate from the mounting rail and the first equipment unit.
Figure 2B:
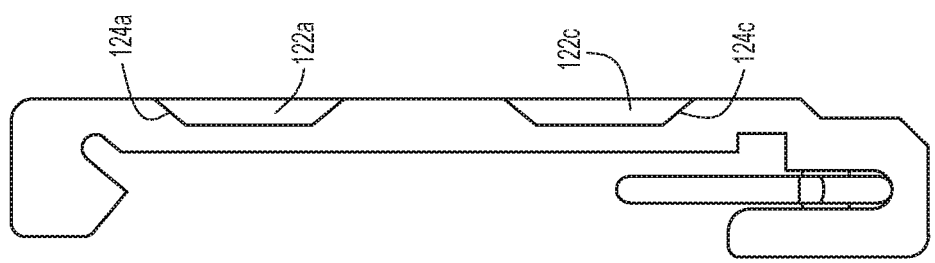
FIG. 2B is a sectional view of the adjustable mounting rail latch of FIG. 1A shown separate from the mounting rail and the first equipment unit.

Referring next to FIG. 2A, shown is a rear perspective view of the adjustable DIN rail latch 100 in a closed configuration. FIG. 2B is a cross-sectional view of the adjustable DIN rail latch 100, taken along line "2-2," while FIG. 2C is another rear perspective view of a section of the adjustable DIN rail latch 100. For ease of description, FIGS. 2A-2C will be described together. Additionally, in FIGS. 2A-2C, the adjustable DIN rail latch 100 is shown separate from the DIN rail 101 and separate from the first and second equipment units 125, 127.

As shown in FIGS. 2A-2C, the adjustable DIN rail latch 100 includes a slide-rail system 106 integrated with the first and second latch modules 102, 104. The slide-rail system 106 is configured to slideably couple the first latch module 102 with the second latch module 104. In other words, the slide-rail system 106 enables the first and second latch modules 102, 104 to be slideably moveable relative to one another in a direction along an axis "A" (FIG. 2A). This relative movement of the first and second latch modules 102, 104 enables the width of the adjustable DIN rail latch 100 to change (e.g., the distance between ends 108, 110 decreases or increases).

In the specific example shown in FIGS. 2A-2C, the slide-rail system 106 includes a plurality of slide members 122 and a plurality of rails 124. The plurality of rails 124 are configured to slideably accommodate the plurality of slide members 122 in such a way that the first and second latch modules 102, 104 are slideably coupled. That is, the plurality of slide members 122 are configured to slideably move along the plurality of rails 124. For example, as the first and second latch modules 102, 104 are moved from the closed configuration shown in FIG. 2A, to an open position, the slide members 122a and 122c may be configured to move along the rails 124a and 124c, respectively, and the slide member 122b may be configured to move along its corresponding rail (not shown). FIG. 2B illustrates that the plurality of slide members 122 may be received by the plurality of rails 124.

As shown in FIGS. 2A-2C, the slide members 122 and rails 124 may form a dovetail-type connection. This, however, is only exemplary and any suitable connection type may be utilized.

FIGS. 2A and 2C also illustrate that the adjustable DIN rail latch 100 includes a plurality of attachment apertures 112. A user may use these attachment apertures 112 to attach one or more equipment units to the adjustable DIN rail latch 100 via insertion of fasteners through the plurality of attachment apertures 112. The fasteners may include, for example, screws, bolts, and/or any suitable fastening mechanisms.

The plurality of attachment apertures 112 may correspond to one or more attachment apertures of one or more equipment units (e.g., the first and second equipment units 125, 127). When the adjustable DIN rail latch 100 is in a closed configuration, for example, the plurality of attachment apertures 112, may be configured to be aligned with respective attachment apertures of the first equipment unit 125. When the adjustable DIN rail latch 100 is in an open configuration, for example, the attachment apertures 112b and 112c may be configured to be aligned with respective attachment apertures of the first equipment unit 125 and the attachment aperture 112a may be configured to be aligned with an attachment aperture of the second equipment unit 127. It is to be understood that not all of the attachment apertures may be used to facilitate attachment of one or more equipment units to the DIN rail latch 100. For example, to attach the DIN rail latch 100 in the closed configuration to the equipment unit 125, fasteners may be disposed through the attachment apertures 112a and 112c but not the attachment aperture 112b. Whether some or all of the attachment apertures are used to facilitate attachment of one or more equipment units may depend on, for example, the size and/or weight of the one or more equipment units, the type(s) of fastener(s), the position of the attachment apertures of the DIN rail latch 100 with respect to the attachment apertures of the one or more equipment units, conditions of the environment the DIN rail latch 100 and the equipment units are to be deployed, and/or any other suitable considerations.

It is to be appreciated that, although the adjustable DIN rail latch 100 is shown as including three attachment apertures 112, this is for exemplary purposes only and not intended to be limiting. Therefore, adjustable DIN rail latches in accordance with embodiments presented herein may include any suitable number of attachment apertures.

Figure 3B:
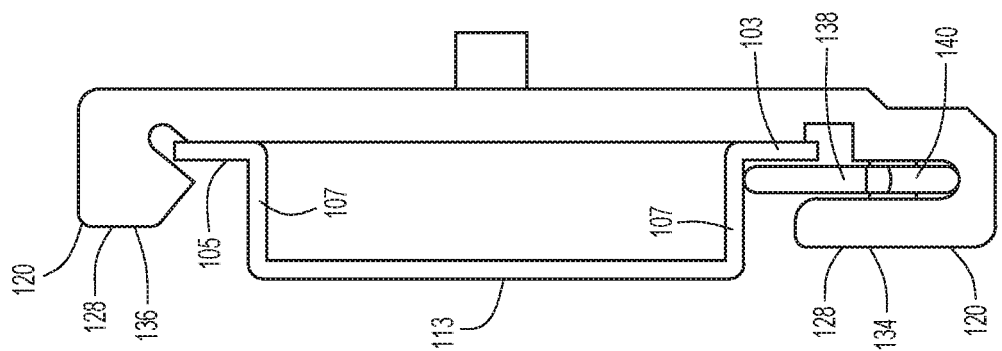
FIG. 3B is a side view of the adjustable mounting rail latch of FIG. 1A shown mechanically coupled to the mounting rail, but separate from the first equipment unit.
Figure 3A:
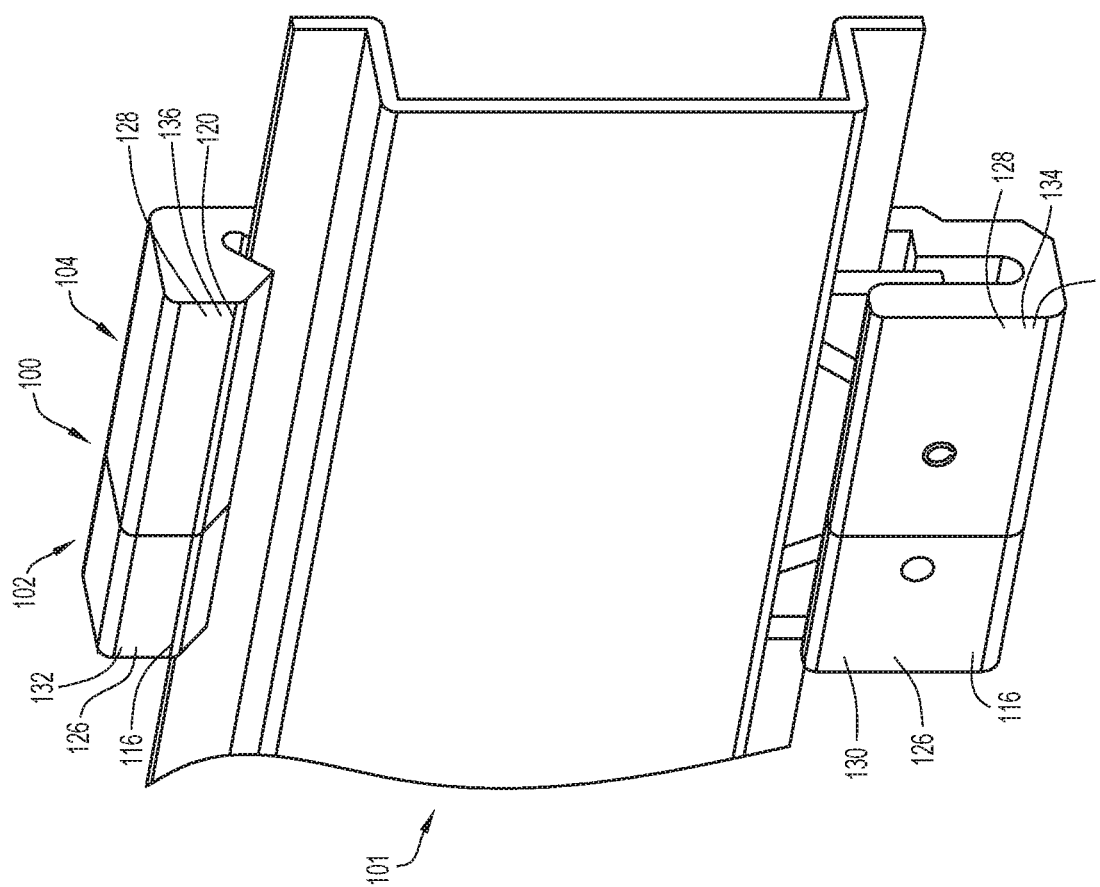
FIG. 3A is a perspective view of the adjustable mounting rail latch of FIG. 1A shown in a closed configuration and mechanically coupled to the mounting rail, but separate from the first equipment unit.

Referring next to FIG. 3A, shown is a perspective view of the adjustable DIN rail latch 100 of FIG. 1A shown in a closed configuration. In FIG. 3A, the adjustable DIN rail latch 100 is shown mechanically coupled to the DIN rail 101, but separate from the first equipment unit 125. FIG. 3B is a side view of the adjustable DIN rail latch 100. For ease of description, FIGS. 3A and 3B will be described together.

As noted above, the first latch module 102 includes the second side 116, and the second latch module 104 may include the second side 120. The second side 116 of first latch module 102 includes an attachment system 126, while the second side 120 of second latch module 104 includes an attachment system 128. Each of the attachment systems 126, 128 may be configured to mechanically couple to a DIN rail, such as, for example, the DIN rail 101. In particular, the attachment system 126 includes a first latch end 130 (e.g., a bottom latch end) and a second latch end 132 (e.g., a top latch end). The attachment system 128 includes a first latch end 134 (e.g., a bottom latch end) and a second latch end 136 (e.g., a top latch end). Each of the first latch ends 130, 134 may be configured to receive at least a portion of a first lip 103 (e.g., a bottom lip) of the DIN rail 101. Each of the second latch ends 132, 136 may be configured to receive at least a portion of a second lip 105 (e.g., a top lip) of the DIN rail 101. In this way, the adjustable DIN rail latch 100 can be attached to the DIN rail 101 (i.e., a second side of each of the latch modules is mechanically coupled to the DIN rail).

The adjustable DIN rail latch 100 further includes at least one retention device 138 configured to be selectively engaged to create a force on the DIN rail 101 to prevent unintended movement of the first and second latch modules 102, 104 along the DIN rail. The retention device 138 may comprise, for example, one or more spring members 140. In certain examples, one or more retention devices 138 may be positioned on each of the first latch module 102 and/or the second latch module 104. For example, the one or more retention devices 138 (e.g., one or more spring members 140) may be mechanically coupled (e.g., pinned) to the first and/or second latch modules 102, 104. For example, at least one retention device 138 (e.g., at least one spring members 140) may be pinned by a pin (e.g., a press fit retention pin) to the first or second latch modules 102, 104 in such a way that allows the retention device 138 to move/rotate at least partially with respect to/around the pin. It is to be appreciated that the at least one retention device 138 being pinned to the first and/or second latch modules 102, 104 is only exemplary and that the at least one retention device 138 may be mechanically coupled to the first and/or second latch modules 102, 104 by any suitable mechanism(s). Further, it is to be appreciated that if a retention device 138 is pinned to the first or second latch module 102, 104, any suitable type(s) of pin(s) may be used, as a press fit retention pin is only exemplary.

The DIN rail 101 comprises a base member 113, a first lip 103, and a second lip 105. The lips 103 and 105 are coupled to the base member 113 via arms 107. To secure the adjustable DIN rail latch 100 to the DIN rail 101, the adjustable DIN rail latch 100 may be positioned such that a force is exerted on the retention device 138 by the arm 107 of the DIN rail 101.

Figure 4B:
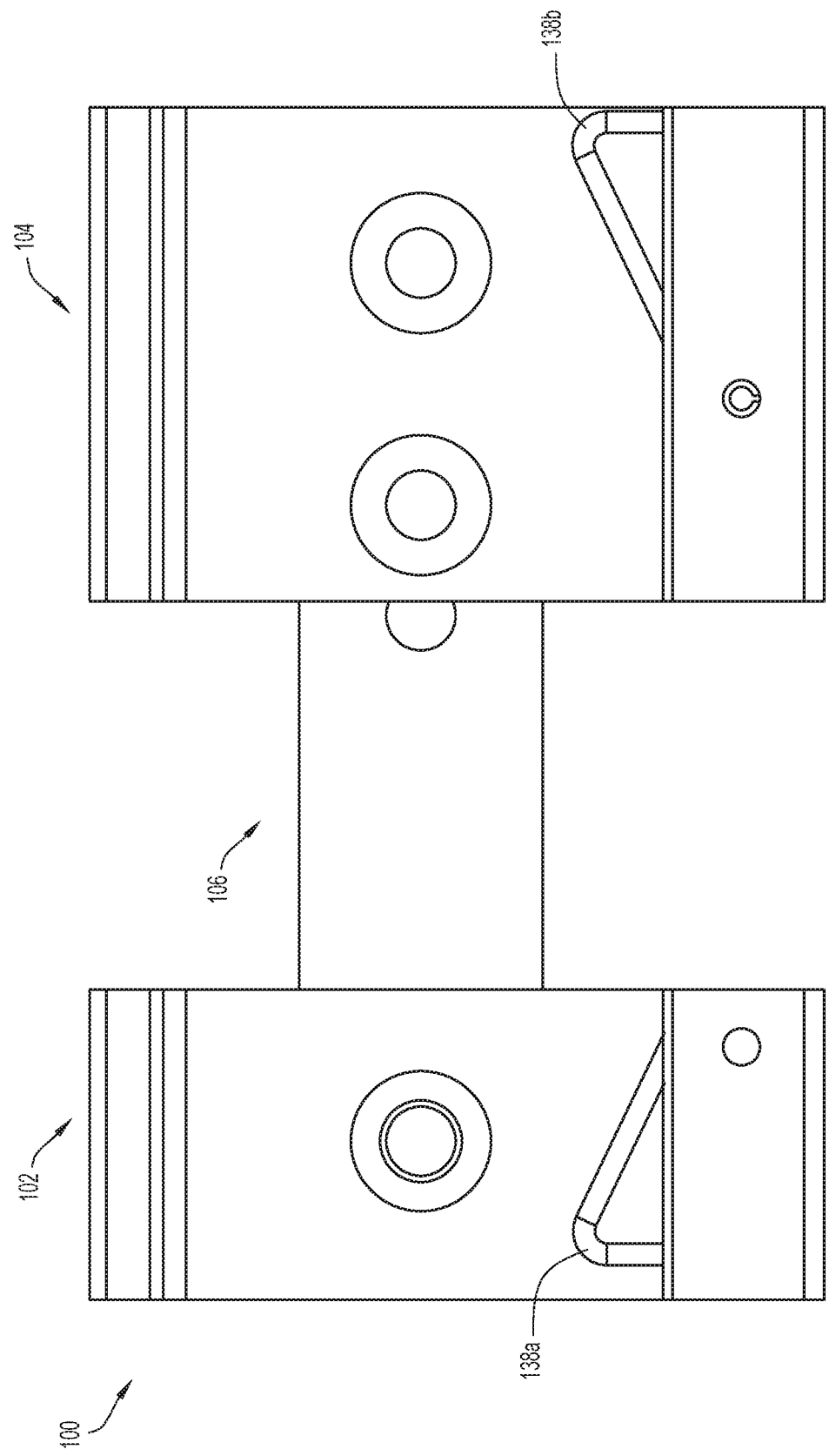
FIG. 4B is a front view of the adjustable mounting rail latch of FIG. 1A, shown in an open configuration and separate from the mounting rail and the first equipment unit.

Referring next to FIGS. 4A and 4B, shown are front views of the adjustable DIN rail latch 100. In particular, FIG. 4A illustrates the adjustable DIN rail latch 100 in a closed configuration, while FIG. 4B illustrates the adjustable DIN rail latch 100 in an open configuration. As noted above, the DIN rail latch 100 includes a retention device 138 on each of the first and second latch modules 102, 104. Such a configuration of the retention devices 138, where at least one retention device 138 is positioned on the first latch module 102 (e.g., the first retention device 138a) and at least one retention device 138 positioned on the second latch module 104 (e.g., the second retention device 138b) is sometimes referred to herein as a "split" configuration.

It is to be appreciated that the split configuration for the retention devices, as shown in FIGS. 4A and 4B, is illustrative and that retention devices in accordance with embodiments presented herein may have different arrangements. For example, FIGS. 5A and 5B are front views of an adjustable DIN rail latch 500, according to an example embodiment, having a different configuration of retention devices.

Figure 5A:
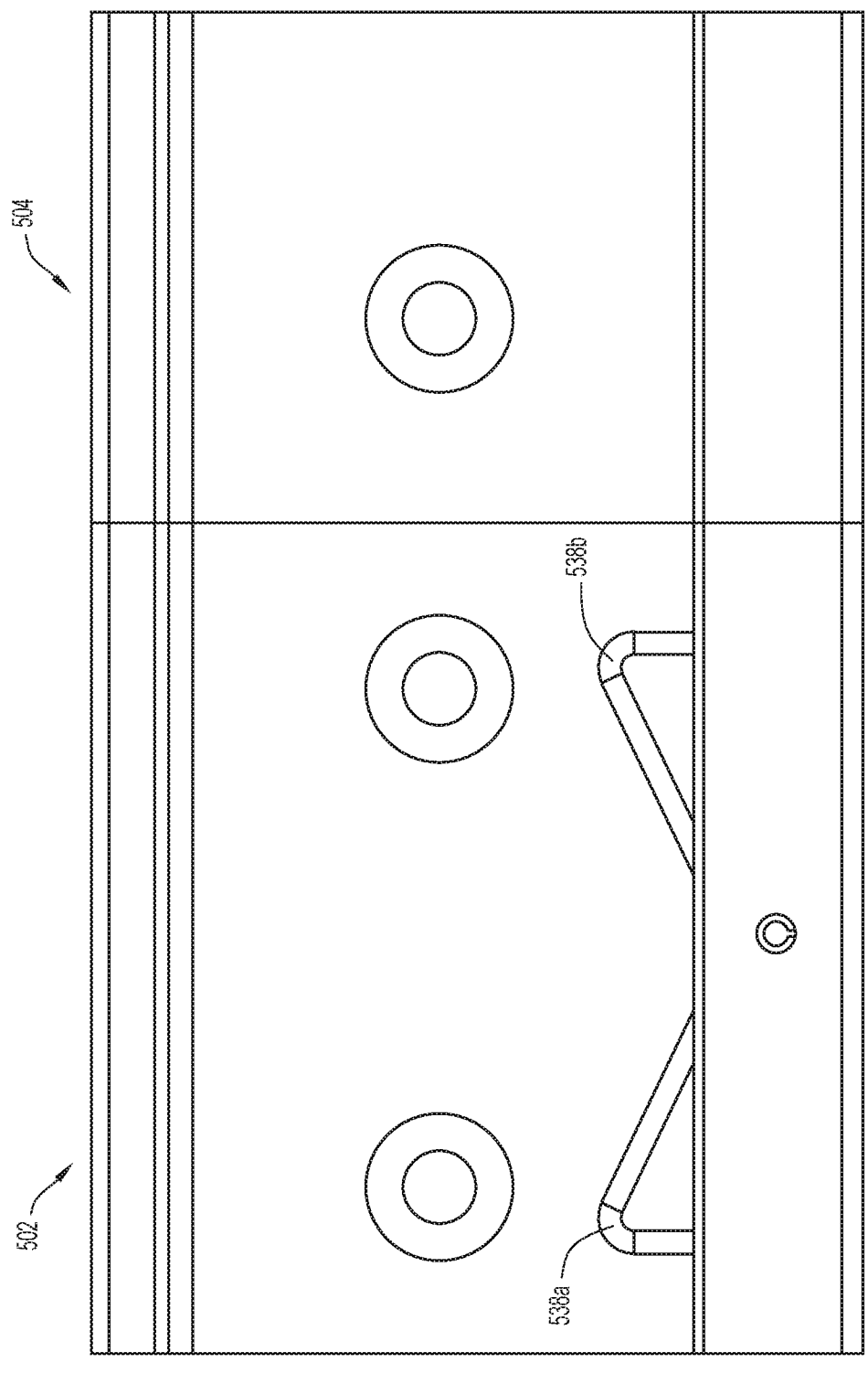
FIG. 5A is a front view of another adjustable mounting rail latch, according to an example embodiment, shown in a closed configuration.
Figure 5B:
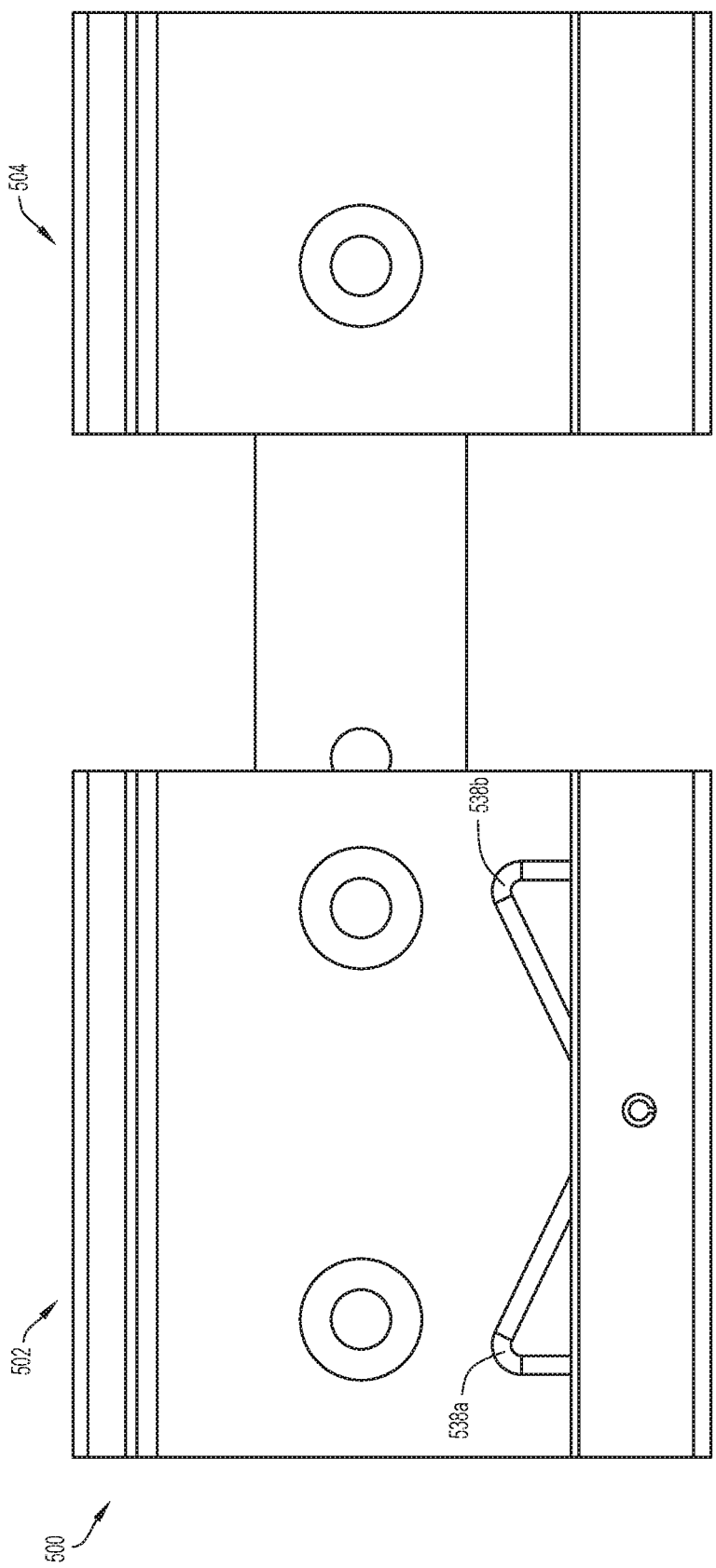
FIG. 5B is a front view of the adjustable mounting rail latch of FIG. 5A, shown in an open configuration.

FIG. 5A illustrates the adjustable DIN rail latch 500 in a closed configuration, while FIG. 5B illustrates the adjustable DIN rail latch 500 in an open configuration. The adjustable DIN rail latch 500 includes first and second latch modules 502, 504. The adjustable DIN rail latch 500 may be the same as the adjustable DIN rail latch 100, except the DIN rail latch 500 includes retention devices only on one of its two latch modules. In particular, the DIN rail latch 500 includes retention devices 538*a*, 538*b*, both of which are positioned on the first latch module 502.

Figure 6:
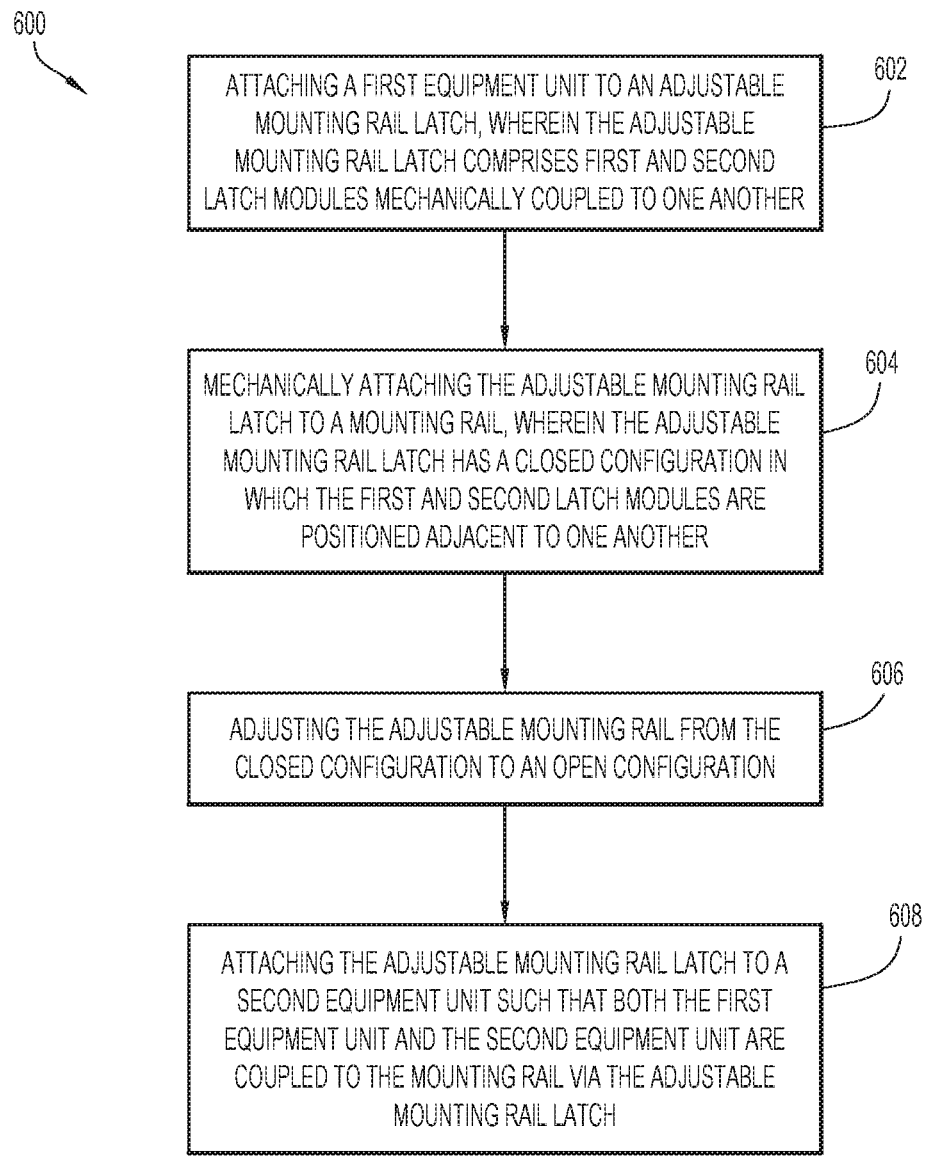
FIG. 6 is a flow chart of a method, according to an example embodiment.

Referring next to FIG. 6, shown is a flowchart of a method 600, according to an example embodiment. The method 600 may be performed with any of the adjustable mounting rail latches described herein. At 602, a first equipment unit is attached to an adjustable mounting rail latch, wherein the adjustable mounting rail latch comprises first and second latch modules mechanically coupled to one another.

At 604, the adjustable mounting rail latch is mechanically attached to a mounting rail, wherein the adjustable mounting rail latch has a closed configuration in which the first and second latch modules are positioned adjacent to one another.

At 606, the adjustable mounting rail is adjusted from the closed configuration to an open configuration. The adjustable mounting rail latch may comprise an integrated slide-rail system, and adjusting the adjustable mounting rail from the closed configuration to the open configuration may comprise, for example, separating the second latch module from the first latch module via the slide-rail system.

At 608, the adjustable mounting rail latch is attached to a second equipment unit such that both the first equipment unit and the second equipment unit are coupled to the mounting rail via the adjustable mounting rail latch.

The adjustable mounting rail latch may comprise at least one selectively engageable retention device, and the method may further comprise exerting a force on the mounting rail with the selectively engageable retention device to prevent movement of the first and second latch modules along the mounting rail. The at least one selectively engageable retention device may comprise a first selectively engageable retention device positioned on the first latch module and a second selectively engageable retention device positioned on the second latch module.

In one aspect, an adjustable mounting rail latch is provided comprising: first and second latch modules each comprising a first side and a second side, wherein each of the first sides is configured to be attached to at least one equipment unit and each of the second sides includes an attachment system configured to mechanically couple to a mounting rail; a slide-rail system integrated with the first and second latch modules, wherein the slide-rail system is configured to slideably couple the first latch module with the second latch module; and at least one selectively engageable retention device configured to exert a force on the mounting rail to prevent movement of the first and second latch modules along the mounting rail.

In certain aspects, the at least one selectively engageable retention device comprises one or more spring members. In certain aspects, the one or more spring members are positioned on the first side of the first latch module. In certain aspects, the one or more spring members are positioned on the first side of the second latch module. In certain aspects, a first spring member is positioned on the first side of the first latch module and a second spring member is positioned on the first side of the second latch module.

In certain aspects, the first and second latch modules each comprise at least one attachment aperture for attachment to the at least one equipment unit.

In certain aspects, the slide-rail system includes a plurality of slide members and a plurality of rails. The plurality of slide members are configured to slideably move along the plurality of rails.

In certain aspects, the at least one selectively engageable retention device is configured to be selectively engaged by an arm of the mounting rail.

In certain aspects, the attachment system includes respective latch ends configured to receive at least a portion of a lip of the mounting rail.

In another aspect, a method is provided. The method comprises: attaching a first equipment unit to an adjustable mounting rail latch, wherein the adjustable mounting rail latch comprises first and second latch modules mechanically coupled to one another; mechanically attaching the adjustable mounting rail latch to a mounting rail, wherein the adjustable mounting rail latch has a closed configuration in which the first and second latch modules are positioned adjacent to one another; adjusting the adjustable mounting rail latch from the closed configuration to an open configuration; and attaching the adjustable mounting rail latch to a second equipment unit such that both the first equipment unit and the second equipment unit are coupled to the mounting rail via the adjustable mounting rail latch.

In yet another aspect, an adjustable mounting rail latch is provided. The adjustable mounting rail latch comprises: first and second latch modules each comprising a first side and a second side, wherein each of the first sides is configured to be attached to at least one equipment unit and each of the second sides includes an attachment system configured to mechanically couple to a mounting rail; and a slide-rail system integrated with the first and second latch modules, wherein the slide-rail system comprises at least one slide member and at least one rail, wherein the at least one rail is configured to slideably accommodate the at least one slide member in such a way that the first and second latch modules are slideably coupled to one another.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. An adjustable mounting rail latch, comprising:
   first and second latch modules each comprising a first side and a second side, wherein each of the first sides is configured to be attached to at least one equipment unit and each of the second sides includes an attachment system configured to mechanically couple to a mounting rail;
   a slide-rail system integrated with the first and second latch modules, wherein the slide-rail system is configured to slideably couple the first latch module with the second latch module and permit relative longitudinal movement of the first and second latch modules to a plurality of different relative locations, wherein each of the different relative locations are configured for attachment to the mounting rail; and
   at least one selectively engageable retention device configured to exert a force on the mounting rail to prevent movement of the first and second latch modules along the mounting rail.

2. The adjustable mounting rail latch of claim 1, wherein the at least one selectively engageable retention device comprises one or more spring members.

3. The adjustable mounting rail latch of claim 2, wherein the one or more spring members are positioned on the first side of the first latch module.

4. The adjustable mounting rail latch of claim 2, wherein the one or more spring members are positioned on the first side of the second latch module.

5. The adjustable mounting rail latch of claim 2, wherein the one or more spring members comprise a first spring member positioned on the first side of the first latch module and a second spring member positioned on the first side of the second latch module.

6. The adjustable mounting rail latch of claim 1, wherein the first and second latch modules each comprise at least one attachment aperture for attachment to the at least one equipment unit.

7. The adjustable mounting rail latch of claim 1, wherein the slide-rail system includes a plurality of slide members and a plurality of rails, wherein the plurality of slide members are configured to slideably move along the plurality of rails.

8. The adjustable mounting rail latch of claim 1, wherein the at least one selectively engageable retention device is configured to be selectively engaged by an arm of the mounting rail.

9. The adjustable mounting rail latch of claim 1, wherein the attachment system includes respective latch ends configured to receive at least a portion of a lip of the mounting rail.

10. An adjustable mounting rail latch, comprising:
first and second latch modules each comprising a first side and a second side, wherein each of the first sides is configured to be attached to at least one equipment unit and each of the second sides includes an attachment system configured to mechanically couple to a mounting rail; and
a slide-rail system integrated with the first and second latch modules and configured to permit relative longitudinal movement of the first and second latch modules to a plurality of different relative locations, wherein each of the different relative locations are configured for attachment to the mounting rail, wherein the slide-rail system comprises at least one slide member and at least one rail, wherein the at least one rail is configured to slideably accommodate the at least one slide member in such a way that the first and second latch modules are slideably coupled to one another.

11. The adjustable mounting rail latch of claim 10, further comprising at least one selectively engageable retention device configured to exert a force on the mounting rail to prevent movement of the first and second latch modules along the mounting rail.

12. The adjustable mounting rail latch of claim 11, wherein the at least one selectively engageable retention device comprises one or more spring members.

13. The adjustable mounting rail latch of claim 12, wherein the one or more spring members are positioned on the first side of the first latch module.

14. The adjustable mounting rail latch of claim 12, wherein the one or more spring members are positioned on the first side of the second latch module.

15. The adjustable mounting rail latch of claim 12, wherein the one or more spring members comprise a first spring member positioned on the first side of the first latch module and a second spring member positioned on the first side of the second latch module.

16. The adjustable mounting rail latch of claim 10, wherein the first and second latch modules each comprise at least one attachment aperture for attachment to the at least one equipment unit.

17. The adjustable mounting rail latch of claim 1, wherein the first and second latch modules have opposing ends, wherein the plurality of different relative locations of the first and second latch modules include a first position and a second position, wherein in the first position the opposing ends of the first and second latch modules are positioned a first distance apart from each other so as to accommodate attachment to at least one first equipment unit and in the second position the opposing ends of the first and second latch modules are positioned a second distance apart from each other so as to accommodate attachment to at least one second equipment unit, and wherein the first distance is greater than the second distance.

18. The adjustable mounting rail latch of claim 10, wherein the first and second latch modules have opposing ends, wherein the plurality of different relative locations of the first and second latch modules include a first position and a second position, wherein in the first position the opposing ends of the first and second latch modules are positioned a first distance apart from each other so as to accommodate attachment to at least one first equipment unit and in the second position the opposing ends of the first and second latch modules are positioned a second distance apart from each other so as to accommodate attachment to at least one second equipment unit, and wherein the first distance is greater than the second distance.

19. The adjustable mounting rail latch of claim 1, wherein the first and second latch modules have opposing ends, and wherein the opposing ends of the first and second latch modules have different physical separations in each of the different relative locations of the first and second latch modules.

20. The adjustable mounting rail latch of claim 10, wherein the first and second latch modules have opposing ends, and wherein the opposing ends of the first and second latch modules have different physical separations in each of the different relative locations of the first and second latch modules.

* * * * *